United States Patent [19]
Fujimoto et al.

[11] Patent Number: 5,773,896
[45] Date of Patent: Jun. 30, 1998

[54] SEMICONDUCTOR DEVICE HAVING OFFSETCHIPS

[75] Inventors: Hiroaki Fujimoto; Shinitsu Takehashi; Takashi Ohtsuka, all of Osaka, Japan

[73] Assignee: Matsushita Electric Industrial Co., Ltd., Osaka, Japan

[21] Appl. No.: 802,025

[22] Filed: Feb. 18, 1997

[30] Foreign Application Priority Data

Feb. 19, 1996 [JP] Japan ................... 8-030301
May 13, 1996 [JP] Japan ................... 8-117588

[51] Int. Cl.⁶ ..................... H01L 23/48; H01L 23/34
[52] U.S. Cl. ............... 257/777; 257/723; 257/777
[58] Field of Search ................... 257/685, 686, 257/723, 777, 778

[56] References Cited

U.S. PATENT DOCUMENTS

| 5,239,447 | 8/1993 | Coutues et al. ............ 361/744 |
| 5,473,196 | 12/1995 | De Givry ................ 257/786 |

FOREIGN PATENT DOCUMENTS

| 58-51527 | 3/1983 | Japan ................ 257/777 |
| 58-73126 | 5/1983 | Japan . |
| 58-92230 | 6/1983 | Japan ................ 257/777 |
| 60-150660 | 8/1985 | Japan ................ 257/777 |
| 2-15660 | 1/1990 | Japan . |
| 4-340758 | 11/1992 | Japan ................ 257/777 |
| 5-6920 | 1/1993 | Japan . |
| 5-175278 | 7/1993 | Japan . |
| 6-151701 | 5/1994 | Japan . |

*Primary Examiner*—Teresa Maria Arroya
*Attorney, Agent, or Firm*—McDermott, Will & Emery

[57] ABSTRACT

A semiconductor device comprises a square-shaped first semiconductor chip having a first LSI, a square-shaped second semiconductor chip having a second LSI, which is smaller in size than the first semiconductor chip and connected to the first semiconductor chip by face down bonding, and a square-shaped package made of a molding resin for packaging the first and second semiconductor chips. The respective centers of the first and second semiconductor chips are offset from each other, while the center of the second semiconductor chip is substantially coincident with the center of the molding resin.

2 Claims, 10 Drawing Sheets

SEMICONDUCTOR DEVICE HAVING OFFSETCHIPS

BACKGROUND OF THE INVENTION

The present invention relates to a semiconductor device composed of a first semiconductor chip having a first LSI and a second semiconductor chip having a second LSI, which have been connected to each other by face down bonding, and to a method of manufacturing the semiconductor device.

In an effort to implement further miniaturized LSI semiconductor devices at lower cost, there has recently been proposed a semiconductor device composed of semiconductor chips having respective LSIs with different functions or formed by different processes, which have been bonded to each other by a face down method.

A description will now be given to the conventional LSI semiconductor device with reference to FIG. 8.

First internal electrodes 111 and bonding pads 112 are formed on a first semiconductor chip 110 having a first LSI, while second internal electrodes 121 are formed on a second semiconductor chip 120 having a second LSI. The first internal electrodes 111 of the first semiconductor chip 110 and the second internal electrodes 121 of the second semiconductor chip 120 are electrically connected to each other via bumps 122 made of solder. An insulating resin 130 is filled in the space between the first and second semiconductor chips 110 and 120, thereby integrating the first and second semiconductor chips 110 and 120.

The first semiconductor chip 110 is fixed to a die pad 131 of a lead frame by using a resin. The bonding pads 112 of the first semiconductor chip 110 are electrically connected to outer leads 132 of the lead frame by bonding wires 133. The first and second semiconductor chips 110 and 120, the bonding wires 133, the die pad 131, and parts of the outer leads 132 are packaged by using a molding resin.

A method of manufacturing the foregoing semiconductor device will be described with reference to FIGS. 8 and 9.

First, as shown in FIGS. 8 and 9, the first internal electrodes 111 and the bonding pads 112 are formed on the first semiconductor chips 110 having the first LSIs, while the second internal electrodes 121 are formed on the second semiconductor chips 120 having the second LSIs, followed by the formation of the bumps 122 made of solder on the second internal electrodes 121. Dicing is then performed with respect to a wafer on which the second semiconductor chips 120 are formed so that the second semiconductor chips 120 are separated from each other. Thereafter, the individual second semiconductor chips 120 are positioned over the first semiconductor chips 110 formed on a wafer.

Next, as shown in FIG. 9, the bumps 122 on the second semiconductor chips 120 are bonded to the first internal electrodes 111 of the first semiconductor chips 110. Dicing is then performed with respect to the wafer on which the first semiconductor chips 110 are formed so that the first semiconductor chips 110 are separated from each other.

Next, as shown in FIG. 8, the insulating resin 130 is filled in the space between the first and second semiconductor chips 110 and 120. Subsequently, the first semiconductor chip 110 is fixed to the die pad 131 of the lead frame by using a resin, while the bonding pads 112 of the first semiconductor chip 110 are connected to the outer leads 132 by the bonding wires 133. Thereafter, the first and second semiconductor chips 110 and 120, the bonding wires 133, the die pad 131, and parts of the outer leads 132 are packaged by using the molding resin 135, resulting in the conventional semiconductor device.

In accordance with the foregoing method of manufacturing the conventional semiconductor device, however, pure water used during the dicing of the wafer on which the first semiconductor chips 110 are formed enters the space between the first semiconductor chips 110 and the second semiconductor chips 120, which necessitates the step of removing the pure water by means of an oven or the like. Moreover, a shearing stress along the plane may be produced under the pressure of the pure water supplied during the dicing of the wafer on which the first semiconductor chips are formed and placed on the connecting portion between the first semiconductor chip 110 and the second semiconductor chip 120. Furthermore, silicon dust may be produced in the step of dicing the wafer on which the first semiconductor chips 110 are formed and enter the space between the first and second semiconductor chips 110 and 120, resulting in a first problem of degraded reliability and lower yield of the semiconductor device.

In the semiconductor device composed of the first semiconductor chip 110 having the first LSI and the second semiconductor chip 120 having the second LSI, which have been connected to each other via the bumps 122, it is necessary to coincide the positions of the first internal electrodes 111 of the first semiconductor chip 110 with the positions of the second internal electrodes 121 of the second semiconductor chip 120. This elongates a wire connecting a functional block formed in the first LSI of the first semiconductor chip 110 to the first internal electrode 111 or a wire connecting a functional block formed in the second LSI of the second semiconductor chip 120 to the second internal electrode 121, resulting in a signal delay in the first or second LSI.

To reduce the length of the wire connecting the functional block formed in the first LSI of the first semiconductor chip 110 to the first internal electrode 111, there has been devised a method of offsetting the positions of the first internal electrodes 111 formed on the first semiconductor chip 110 from the center of the first semiconductor chip 110 by bringing the first internal electrodes 111 closer to the functional block formed in the first LSI.

However, when the positions of the first internal electrodes 111 are offset from the center of the first semiconductor chip 110, the distance between one side face of the second semiconductor chip 120 and the corresponding outer face of the molding resin 135 differs from the distance between another side face of the second semiconductor chip 120 and the corresponding outer face of the molding resin 135, because the center position of the first semiconductor chip 110 should coincide with the center position of the second semiconductor chip 120. Accordingly, the amount of the molding resin 135 present on the sides of the second semiconductor chip 120 differs from one portion to another, resulting in different curing compressive stresses placed on the side faces of the second semiconductor chip 120 when the molding resin 135 is cured. Specifically, the curing compressive stress is larger in a region in which the molding resin 135 exists in a larger amount (the region indicated by A in FIG. 10(b)) than in a region in which the molding resin 135 exists in a smaller amount (the region indicated by B in FIG. 10(b)). Although the temperature of the molding resin 135 increases in mounting the semiconductor device on a printed circuit board and the molding resin 135 is thermally expanded thereby, a thermal stress produced by the thermal expansion and placed on the second semiconductor chip 120 also differs from one side face to another. Specifically, the thermal stress is larger in the region A in which the molding resin 135 exists in a larger amount than in the region B in which the molding resin 135 exists in a smaller amount. Accordingly, the curing compressive stress and thermal stress placed on the side face a of the second semiconductor chip 120 corresponding to the region A in which the molding resin 135 exists in a larger amount are larger than those place on the side face b corresponding to the region B in which the molding resin 135 exists in a smaller amount. Consequently, a shearing stress along the plane resulting from different curing compressive stresses and different thermal stresses is placed on the connecting portion between the first and second semiconductor chips 110 and 120, presenting a second problem of degraded reliability and lower yield of the semiconductor device.

SUMMARY OF THE INVENTION

In view of the foregoing, a first object of the present invention is to prevent an ingression of pure water in the space between first and second semiconductor chips during dicing, thereby eliminating the step of removing the pure water by means of an oven or the like, to prevent the pure water supplied during the dicing of a wafer on which the first semiconductor chips are formed from exerting pressure on the connecting portion between the first and second semiconductor chips, and to prevent an ingression of dust produced from a substrate during the dicing of the wafer on which the first semiconductor chips are formed, thereby improving the reliability and yield of a semiconductor device. A second object of the present invention is to reduce a curing compressive stress and a thermal stress developed in a package and placed on the connecting portion between the first and second semiconductor chips, thereby improving the reliability and yield of the semiconductor device.

To attain the second object, a semiconductor device according to the present invention comprises: a first semiconductor chip having a first LSI; a second semiconductor chip having a second LSI, the second semiconductor chip being smaller in size than the first semiconductor chip and connected to the first semiconductor chip by face down bonding; and a package for packaging the first and second semiconductor chips, wherein the center of the first semiconductor chip is offset from the center of the second semiconductor chip in a first direction in which a first one of two contiguous edges of the second semiconductor chip extends, the first edge being as long as or shorter than the other one of the two contiguous edges, while the center of the second semiconductor chip is substantially coincident with the center of the package.

In the semiconductor device according to the present invention, the center of the second semiconductor chip is substantially coincident with the center of the package in the first direction in which the first one of the two contiguous edges of the second semiconductor chip extends, the first edge being as long as or shorter than the other one of the two contiguous edges. Consequently, the individual side faces of the second semiconductor chip are substantially equidistant from the corresponding outer faces of the package. As a result, a substantially equal curing compressive stress is placed on the side faces of the second semiconductor chip extending in the first direction when the package is cured, while a substantially equal thermal stress is placed on the side faces of the second semiconductor chip extending in the first direction as the package is thermally expanded. Although the curing compressive stress and thermal stress placed on the first semiconductor chip slightly differs from one side face to another extending in the first direction, the difference between the curing compressive stresses and the difference between the thermal stresses developed in the package and placed on the side faces of the first semiconductor chip extending in the first direction are smaller in the semiconductor device according to the present invention than the difference between the curing compressive stresses and the difference between the thermal stresses developed in the package to be placed on the side faces of the second semiconductor chip in the conventional semiconductor device.

Accordingly, the shearing stress along the plane resulting from different curing compressive stresses and different thermal stresses developed in the package and placed on the connecting portion between the first and second semiconductor chips is smaller in the semiconductor device according to the present invention than in the conventional semiconductor device, resulting in improved reliability and yield of the semiconductor device.

In the semiconductor device according to the present invention, the center of the first semiconductor chip is preferably offset from the center of the second semiconductor chip in a second direction in which a second one of the two contiguous edges of the second semiconductor chip extends, the second edge being different from the first edge, while the center of the second semiconductor chip is preferably substantially coincident with the center of the package.

In the arrangement, a substantially equal curing compressive stress and a substantially equal thermal stress are developed in the package to be placed on the side faces of the second semiconductor chip extending in the second direction, resulting in further improved reliability and yield of the semiconductor device.

To attain the second object, a first method of manufacturing a semiconductor device according to the present invention comprises: a chip connecting step of connecting, by face down bonding, a first semiconductor chip having a first LSI to a second semiconductor chip having a second LSI, the second semiconductor chip being smaller in size than the first semiconductor chip; and a chip packaging step of packaging the first and second semiconductor chips connected to each other in a package, wherein the chip connecting step includes the step of connecting the first semiconductor chip to the second semiconductor chip such that the center of the first semiconductor chip is offset from the center of the second semiconductor chip in a first direction in which a first one of two contiguous edges of the second semiconductor chip extends, the first edge being as long as or shorter than the other one of the two contiguous edges, and that the center of the second semiconductor chip is substantially coincident with the center of the package.

In accordance with the first method of manufacturing a semiconductor device, the chip connecting step includes the step of connecting the first semiconductor chip to the second semiconductor chip such that the center of the second semiconductor chip is substantially coincident with the center of the package in the first direction. Consequently, a substantially equal curing compressive stress and a substantially equal thermal stress are developed in the package to be placed on the side faces of the second semiconductor chip extending in the first direction in the obtained semiconductor device, resulting in improved reliability and yield of the semiconductor device.

In the first method of manufacturing a semiconductor device, the chip connecting step preferably includes the step of connecting the first semiconductor chip to the second semiconductor chip such that the center of the first semiconductor chip is offset from the center of the second semiconductor chip in a second direction in which a second one of the two contiguous edges of the second semiconductor chip extends, the second edge being different from the first edge, and that the center of the second semiconductor chip is substantially coincident with the center of the package.

In the arrangement, a substantially equal curing compressive stress and a substantially equal thermal stress are developed in the package to be placed on the side faces of the second semiconductor chip extending in the second direction in the obtained semiconductor device. Consequently, the shearing stress along the plane placed on the connecting portion between the first and second semiconductor chips is further reduced compared with the shearing stress developed in the conventional semiconductor device, resulting in further improved reliability and yield of the semiconductor device.

To attain the first object, a second method of manufacturing a semiconductor device according to the present invention is based on a method of manufacturing a semiconductor device composed of a first semiconductor chip having a first LSI and a second semiconductor chip having a second LSI, the second semiconductor chip being smaller in size than the first semiconductor chip and connected to the first semiconductor chip by face down bonding and comprises: a first chip separating step of dicing a semiconductor wafer on which a plurality of second semiconductor chips are formed and separating the plurality of second semiconductor chips from each other; a chip connecting step of individually connecting, by face down bonding, the plurality of second semiconductor chips separated from each other to a plurality of first semiconductor chips formed on a semiconductor wafer; a resin filling step of filling an insulating resin in each of the spaces between the plurality of first semiconductor chips and the plurality of second semiconductor chips connected to each other; and a second chip separating step of dicing the semiconductor wafer on which the plurality of first semiconductor chips are formed and separating the plurality of first semiconductor chips from each other.

In accordance with the second method of manufacturing a semiconductor device, the dicing of the semiconductor wafer on which the first semiconductor chips are formed and the separation of the first semiconductor chips are performed after the insulating resin has been filled in the space between the first and second semiconductor chips. Consequently, pure water used in the dicing step is prevented from entering the space between the first and second semiconductor chips, which eliminates the necessity for the step of evaporating the pure water lying between the first and second semiconductor chips by means of an oven or the like, resulting in a reduced number of process steps and lower cost. Moreover, the connecting portions between the first and second semiconductor chips are not damaged even when water exerts pressure on the second semiconductor chips during dicing. Furthermore, dust produced from the substrate during dicing is prevented from entering the space between the first and second semiconductor chips, resulting in improved reliability and yield of the semiconductor device.

Preferably, the second method of manufacturing a semiconductor device further comprises, between the resin filling step and the second chip separating step, a chip polishing step of polishing the faces of the second semiconductor chips on the other side of the faces thereof opposed to the first semiconductor chips.

In the arrangement, polishing is performed with respect to the second semiconductor chips securely fixed to the first semiconductor chips formed on a wafer, resulting in increased mechanical strength and stable polishing. Moreover, the second semiconductor chips can be polished to have a smaller thickness than in the conventional semiconductor device, resulting in an extremely thin LSI semiconductor device composed of the first and second semiconductor chips integrated with each other.

Preferably, the second method of manufacturing a semiconductor device further comprises, between the resin filling step and the second chip separating step, a chip polishing step of forming a resin layer surrounding the second semiconductor chips on the faces of the first semiconductor chips opposed to the second semiconductor chips and polishing the faces of the second semiconductor chips on the other side of the faces thereof opposed to the first semiconductor chips.

In the arrangement, mechanical strength is further increased and polishing becomes more stable, while the second semiconductor chip can be polished to have a further reduced thickness, resulting in a thinner LSI semiconductor device.

DETAILED DESCRIPTION OF THE PRESENT INVENTION (First Embodiment)

Referring now to FIGS. 1(a) to 1(c) and FIGS. 2(a) to 2(c), a method of manufacturing a semiconductor device according to a first embodiment of the present invention will be described.

Figure 1A:
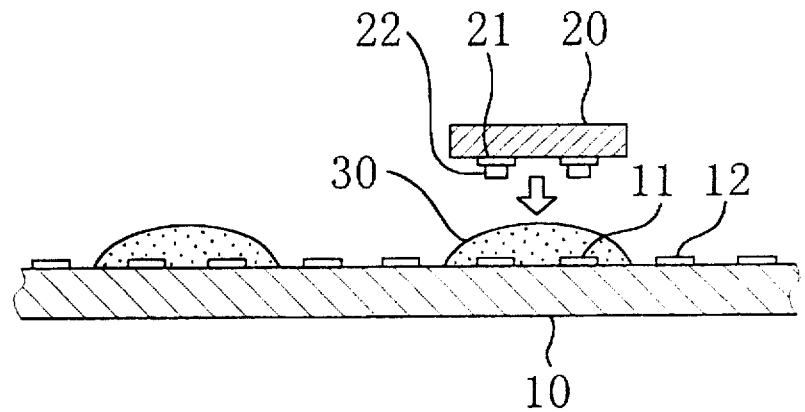
FIGS. 1(a) to 1(c) are cross-sectional views illustrating individual process steps in a method of manufacturing a semiconductor device according to a first embodiment of the present invention.

First, as shown in FIG. 1(a), first internal electrodes 11 made of aluminum and bonding pads 12 are formed on each of a plurality of first semiconductor chips 10 having a first LSI and formed on a first semiconductor wafer. On the other hand, second internal electrodes 21 made of aluminum are formed on each of a plurality of second semiconductor chips 20 having a second LSI, smaller in size than the first semiconductor chip 10, and formed on a second semiconductor wafer, followed by the formation of bumps 22 made of solder on the respective second internal electrodes 21.

As a material composing the bump 22, metal such as Au, In, In-Sn, Pb-Sn, Cu, or Ni may be used. The diameter of the bump 22 may range from 1 to 100 μm, while the height thereof may range from 1 to 50 μm. It is also possible to form, by electroless plating, a Ni/Au barrier metal layer (not shown) on the second internal electrodes 21 made of aluminum and to form the bumps 22 on the barrier metal layer by electrolytic plating, electroless plating, dipping, or transferring.

Instead of forming the bumps 22 on the second internal electrodes 21 of the second semiconductor chips 20, bumps may be formed on the first internal electrodes 11 of the first semiconductor chips 10.

Dicing is then performed with respect to the second semiconductor wafer on which the second semiconductor chips 20 are formed so that the plurality of second semiconductor chips 20 are separated from each other. After that, the insulating resin 30 composed of, e.g., a UV-setting epoxy resin is applied to the regions of the first semiconductor chips 10 on which the second semiconductor chips 10 are to be mounted.

Instead of the UV-setting epoxy resin, a thermosetting or cold-setting epoxy resin may be used as the insulating resin 30. Alternatively, an acrylic resin, a polyimide resin, a urethane resin or the like, each of which is thermosetting, UV-setting, or cold-setting, may also be used as the insulating resin 30. The insulating resin 30 may be applied adequately by dispensing, printing, or stamping.

Although the insulating resin 30 has been applied to the regions of the first semiconductor chips 10 on which the second semiconductor chips 20 are to be mounted, it is also possible to apply the insulating resin 30 to the second semiconductor chips 20.

Next, each of the second semiconductor chips 20 is positioned over the corresponding one of the first semiconductor chips 10 formed on the wafer, while the bumps 22 of the second semiconductor chip 20 are aligned with the first internal electrodes 11 of the first semiconductor chip 10. Subsequently, the second semiconductor chip 20 is brought closer to the first semiconductor chip 10 so that the bumps 22 of the second semiconductor chips 20 contact the first internal electrodes 11 of the first semiconductor chip 10.

Although the bumps 22 of the second semiconductor chip 20 are brought in contact with the first internal electrodes 11 of the first semiconductor chip 10 after the coating of the first semiconductor chip 10 with the insulating resin 30, it is also possible to bring the bumps 22 of the second semiconductor chip 20 into contact with the first internal electrodes 11 of the first semiconductor chip 10 prior to filling the insulating resin 30 in the space between the first and second semiconductor chips 10 and 20.

Figure 1B:
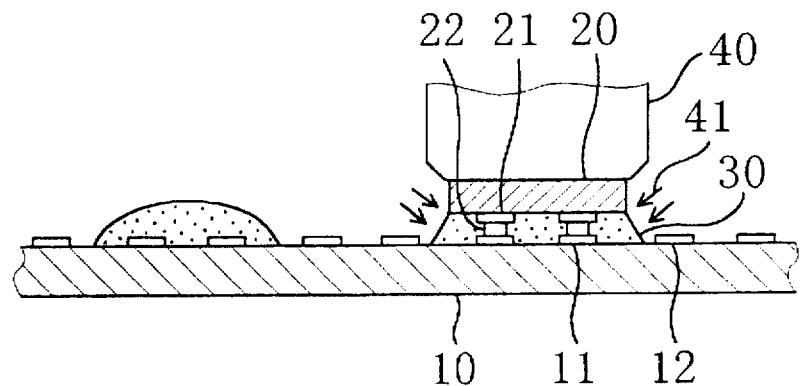

Next, as shown in FIG. 1(b), the second semiconductor chip 20 is pressed against the first semiconductor chip 10 by means of a pressing tool 40 to bond the bumps 22 of the second semiconductor chip 20 to the first internal electrodes 11 of the first semiconductor chip 10, while the insulating resin 30 is spread out between the first semiconductor chip 10 and the second semiconductor chip 20. As a result, the second semiconductor chip 20 is temporarily fixed to the first semiconductor chip 10 by the viscosity of the insulating resin 30. To achieve a proper pressing force, the pressing tool 40 suitably places a load of 0.1 to 20 g on one bump 22. The magnitude of the load is determined so as not to damage the first internal electrodes 11 of the first semiconductor chip 10 or not to change the characteristics of transistors and wires formed below the first internal electrodes 11.

Next, the insulating resin 30 is cured with the radiation of an UV ray 41 from around the first semiconductor chip 10, thereby integrating the first semiconductor chip 10 and the second semiconductor chip 20. The amount of energy of the UV ray 41 varies depending on the type of the insulating resin 30, but the UV ray 41 is typically radiated at a dose of 200 to 5000 mJ for several seconds. Thereafter, the pressing force applied by the pressing tool 40 is removed and the insulating resin 30 is held at a room temperature or an elevated temperature to be cured. The foregoing process is performed with respect to the individual second semiconductor chips 20 to integrate the second semiconductor chips 20 and the first semiconductor chips 10 formed on the wafer.

In the case where the insulating resin 30 is thermosetting, it is cured with the application of heat via the pressing tool 40. Typically, the insulating resin 30 is heated at a temperature of about 70° to 250° C. for several to several tens of seconds, followed by the removal of the pressing force applied by the pressing tool 40.

As for the step of applying the pressing force to the second semiconductor chip 20 by means of the pressing tool 40 and the step of curing the insulating resin 30, pressing and curing may be performed alternately with respect to each of the second semiconductor chips 20 or, alternatively, pressing may be performed with respect to the plurality of second semiconductor chips 20 at a time and then curing may be performed simultaneously with respect to the insulating resin 30 between the plurality of first and second semiconductor chips 10 and 20.

Figure 1C:
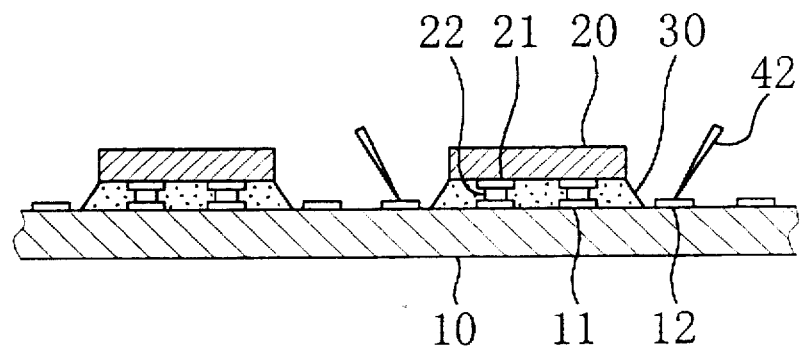

Next, as shown in FIG. 1(c), probe terminals 42 of a prober are brought in contact with the bonding pads 12 of the first semiconductor chip 10 to examine the electric properties of the first and second LSIs of the first and second semiconductor chips 10 and 20 simultaneously.

Figure 2A:
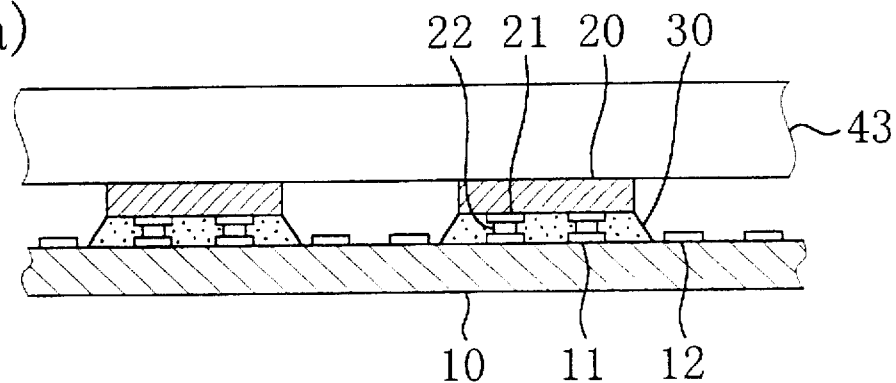
FIGS. 2(a) to 2(c) are cross-sectional views illustrating the individual process steps in the method of manufacturing the semiconductor device according to the first embodiment.

Next, as shown in FIG. 2(a), the back faces of the plurality of second semiconductor chips 20 are polished simultaneously with a rotating diamond wheel 43. In this case, since the second semiconductor chips 20 have been fixed securely to the first semiconductor chips 10 formed on the wafer by means of the insulating resin 30 and hence mechanical strength has been increased, the second semiconductor chips 20 having initial thicknesses of 400 to 680 nm can be polished to a thickness of about 10 μm.

Instead of performing polishing by using the diamond wheel 43, polishing may be performed by using alumina or chemical polishing may be performed with regions not to be polished covered with a resist or wax.

In addition to polishing performed with respect to the second semiconductor chips 20, polishing may also be performed with respect to the first semiconductor chips 10 formed on the wafer. In this case, since the second semiconductor chips 20 have been fixed to the first semiconductor chips 10 by means of the insulating resin 30, the rigidity of the first semiconductor chips 10 formed on the wafer is enhanced so that the first semiconductor chips 10 in the present embodiment can be polished thinner than in a conventional embodiment. Polishing thus performed with respect to the first and second semiconductor chips 10 and 20 can further reduce the thickness of the semiconductor device composed of the first and second semiconductor chips 10 and 20. However, since excessive polishing of the first semiconductor chips 10 may impair the first semiconductor chips 10 in the subsequent dicing step performed with respect to the first semiconductor wafer, the maximum permissible amount of polishing for the first semiconductor chips 10 is limited. By contrast, the second semiconductor chips 20 which have already been separated from each other through dicing can be polished to have a minimum thickness.

Figure 2B:
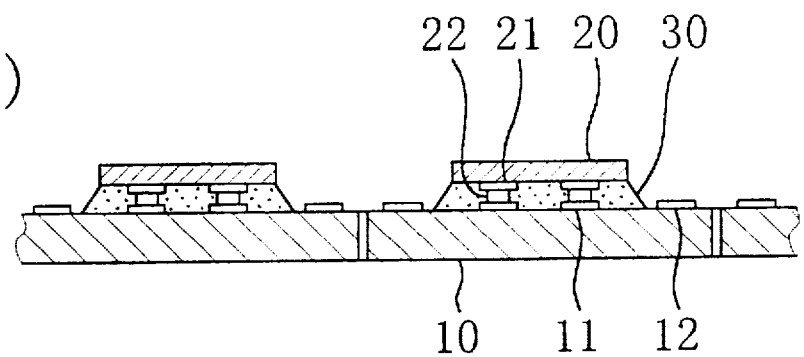

Then, as shown in FIG. 2(b), dicing is performed with respect to the first semiconductor wafer on which the first semiconductor chips 10 are formed.

Figure 2C:
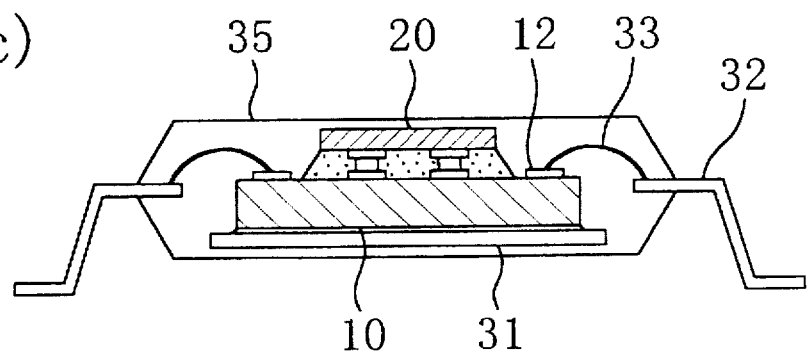

Next, as shown in FIG. 2(c), each of the first semiconductor chips 10 separated from each other is fixed to a die pad 31 of a lead frame by using a resin, while the bonding pads 12 of the first semiconductor chip 10 are connected to outer leads 32 of the lead frame by bonding wires 33. Thereafter, the first and second semiconductor chips 10 and 20, the bonding wires 33, the die pad 31, and parts of the outer leads 32 are packaged by using a molding resin 35, resulting in the LSI semiconductor device composed of the first and second semiconductor chips 10 and 20 integrated with each other.

In the method of manufacturing the semiconductor device according to the first embodiment, dicing is performed with respect to the wafer on which the first semiconductor chips 10 are formed after the filling of the insulating resin 30 in the space between the second semiconductor chip 20 and the first semiconductor chip 10, so that the following effects are obtained.

First, since pure water used in the dicing step is prevented from entering the space between the first semiconductor chip 10 and the second semiconductor chip 20, the step of evaporating the pure water lying between the chips by means of an oven or the like can be omitted. Although the step of blowing off the pure water attached to the first and second semiconductor chips 10 and 20 should be performed, it presents no serious problem since the time required by the step of blowing off the pure water is as long as the time required to cut a single semiconductor wafer.

Second, since the second semiconductor chips 20 are fixed to the first semiconductor chips 10 formed on the wafer by means of the insulating resin 30, the connecting portions between the first semiconductor chips 10 and the second semiconductor chips 20 suffer no damage even when water exerts lateral pressure on the second semiconductor chips 20 in the step of dicing the wafer on which the first semiconductor chips 10 are formed, resulting in improved reliability and yield of the semiconductor device.

Third, silicon dust produced in the step of dicing the wafer on which the first semiconductor chips 10 are formed is prevented from entering the space between the first semiconductor chip 10 and the second semiconductor chip 20.

Fourth, since the examination of the electric properties of the second semiconductor chip 20 has been complete with the second semiconductor chip 20 bonded to the first semiconductor chip 10, only the semiconductor chips judged to be satisfactory based on the result of the examination can be packaged by using the molding resin 30. In other words, since defective semiconductor chips need not be packaged, the cost of the packaging step is reduced.

Fifth, since the first embodiment examines the electric properties by bringing the probe terminals 42 in contact with the bonding pads 12 of the first semiconductor chips 10 formed on the wafer, the plurality of semiconductor chips can be examined simultaneously, resulting in reduced time required by the examining step. It is to be noted that the examination of the electric properties may be performed before or after the step of filling the insulating resin 30 in the space between the first and second semiconductor chips 10 and 20.

(Second Embodiment)

Referring now to FIGS. 3(a) to 3(c) and FIGS. 4(a) and 4(b), a method of manufacturing a semiconductor device according to a second embodiment of the present invention will be described.

Figure 3A:
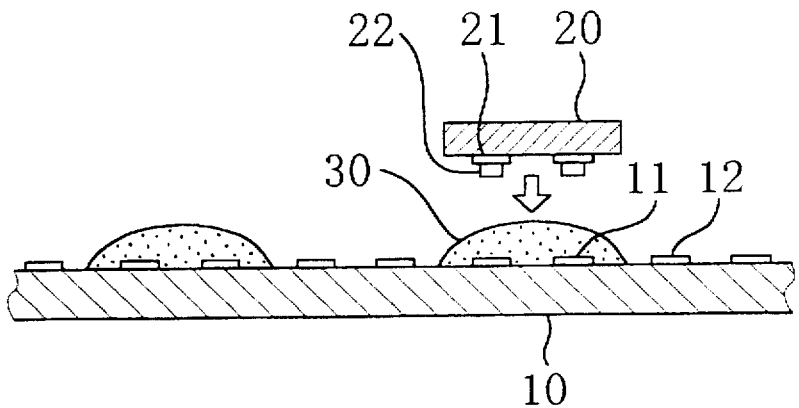
FIGS. 3(a) to 3(c) are cross-sectional views illustrating individual process steps in a method of manufacturing a semiconductor device according to a second embodiment of the present invention.

As shown in FIG. 3(a), first internal electrodes 11 and bonding pads 12 are formed on each of first semiconductor chips 10 having a first LSI, while second internal electrodes 21 are formed on each of second semiconductor chips 20 having a second LSI, followed by the formation of bumps 22 on the second internal electrodes 21, similarly to the first embodiment. Dicing is then performed with respect to a second semiconductor wafer on which the second semiconductor chips 20 are formed so that the second semiconductor chips 20 are separated from each other. Subsequently, the insulating resin 30 is applied to the region of the first semiconductor chip 10 on which the second semiconductor chip 20 is to be mounted. After that, the bumps 22 of the second semiconductor chip 20 are brought in contact with the first internal electrodes 11 of the first semiconductor chip 10.

Figure 3B:
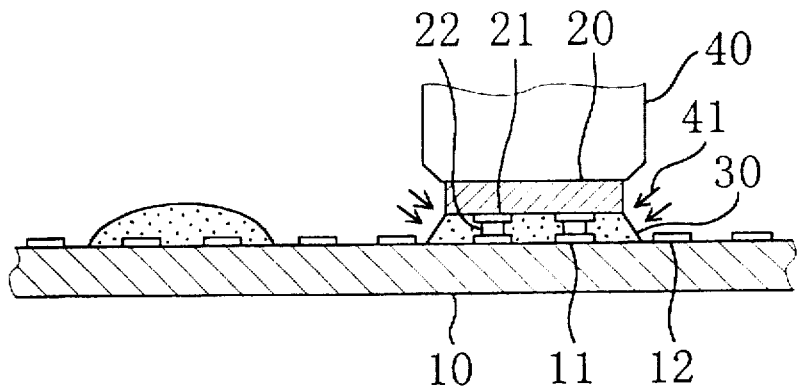

Next, as shown in FIG. 3(b), the second semiconductor chip 20 is pressed against the first semiconductor chip 10 by means of the pressing tool 40 to bond the bumps 22 of the second semiconductor chip 20 to the first internal electrodes 11 of the first semiconductor chip 10, while the insulating resin 30 is spread out between the first semiconductor chip 10 and the second semiconductor chip 20. Thereafter, the insulating resin 30 is cured with the radiation of a UV ray, thereby integrating the first semiconductor chip 10 and the second semiconductor chip 20.

Figure 3C:
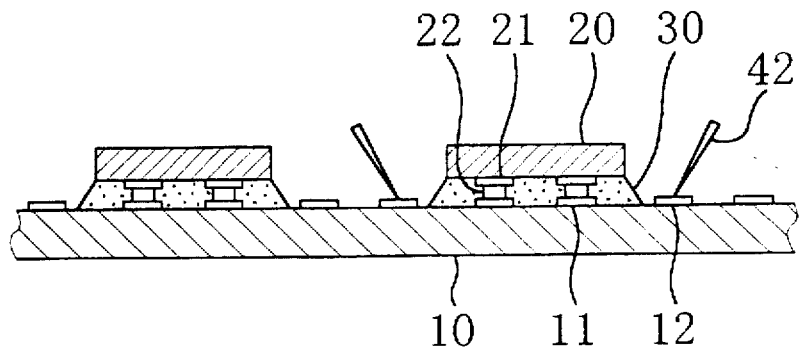

Next, as shown in FIG. 3(c), probe terminals 42 of a prober are brought in contact with the bonding pads 12 of the first semiconductor chip 10 to examine the electric properties of the first and second LSIs of the first and second semiconductor chips 10 and 20 simultaneously.

Figure 4A:
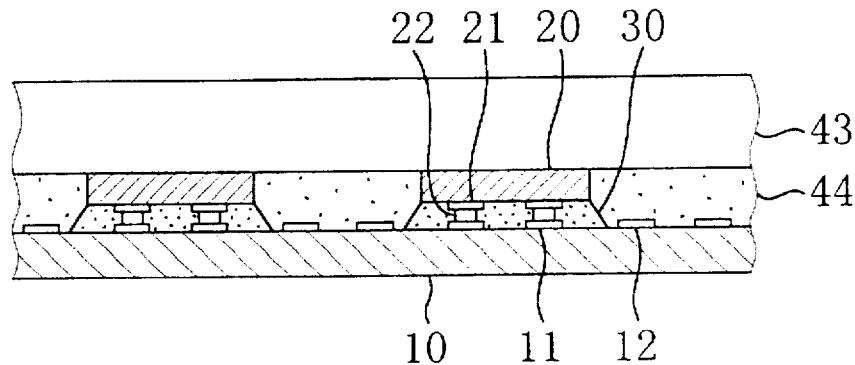
FIGS. 4(a) to 4(c) are cross-sectional views illustrating the individual process steps in the method of manufacturing the semiconductor device according to the second embodiment.

Next, as shown in FIG. 4(a), a chip holding resin 44 is deposited over the entire surface of the first semiconductor chips 10 formed on a wafer to a height at which the top face of the chip holding resin 44 is substantially flush with the top faces of the second semiconductor chips 20. After that, the back faces of the plurality of second semiconductor chips 20 are polished simultaneously with a rotating diamond wheel 43. In this case, since the second semiconductor chips 20 are fixed to the first semiconductor chips 10 formed on the wafer by means of the insulating resin 30 and the chip holding resin 44, the second semiconductor chips 20 can be polished more positively. When the polishing of the second semiconductor chips 20 is complete, the chip holding resin 44 is removed by using a solution. To prevent the insulating resin 30 from being removed during the removal of the chip holding resin 44, the chip holding resin 44 and the insulating resin 30 are composed of different types of resins, while a solution which dissolves the chip holding resin 44 and does not dissolve the insulating resin 30 is used to remove the chip holding resin 44.

Figure 4B:
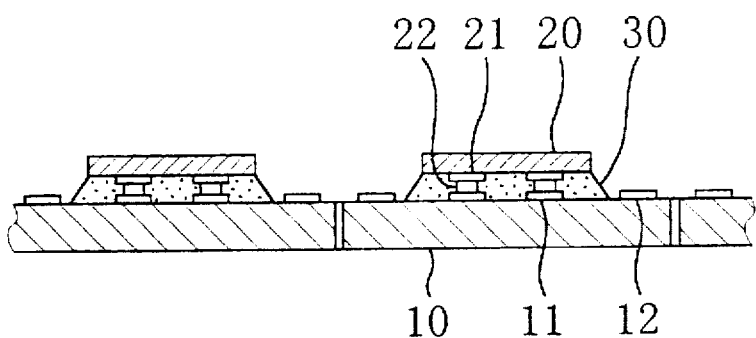
Figure 4C:
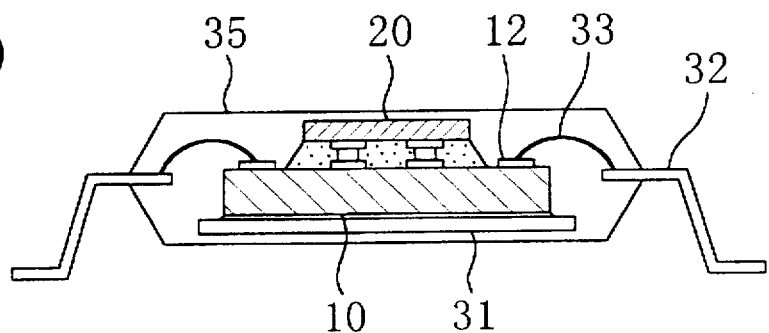

Then, as shown in FIG. 4(b), dicing is performed with respect to the first semiconductor wafer on which the first semiconductor chips 10 are formed. After the separation of the first semiconductor chips 10, each of the first semiconductor chips 10 is fixed to a die pad 31 of a lead frame, while the bonding pads 12 of the first semiconductor chip 10 are connected to outer leads 32 by bonding wires 33. Thereafter, the first and second semiconductor chips 10 and 20, the bonding wires 33, the die pad 31, and parts of the outer leads 32 are packaged by using a molding resin 35, resulting in the semiconductor device as shown in FIG. 4(c).

(Third Embodiment)

Referring now to FIGS. 5(a) to 5(c) and FIGS. 6(a) and 6(b), a method of manufacturing a semiconductor device according to a third embodiment of the present invention will be described.

Figure 5A:
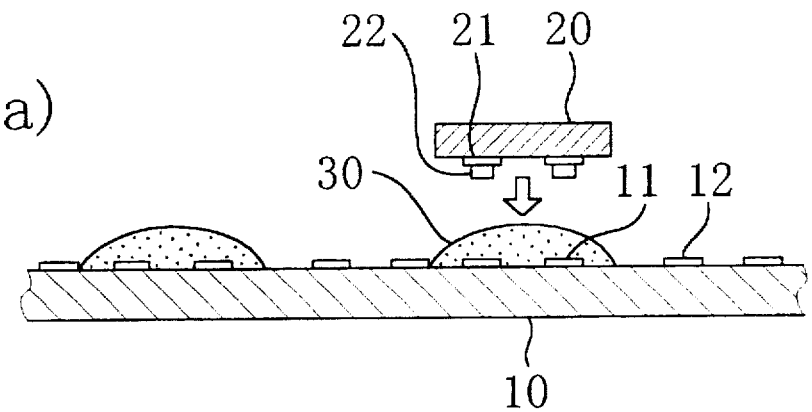
FIGS. 5(a) to 5(c) are cross-sectional views illustrating individual process steps in a method of manufacturing a semiconductor device according to a third embodiment of the present invention.

As shown in FIG. 5(a), first internal electrodes 11 and bonding pads 12 are formed on each of square-shaped first semiconductor chips 10 having a first LSI, while second internal electrodes 21 are formed on each of square-shaped second semiconductor chips 20 having a second LSI and smaller in size than the first semiconductor chip 10, followed by the formation of bumps 22 on the second internal electrodes 21, similarly to the first embodiment. In the present embodiment, the positions of the first internal electrodes 11 are offset to the left from the center of the first semiconductor chip 10 so as to reduce the distance between a functional block in the first LSI and the first internal electrode 11 and thereby reduce signal delay time in the first LSI.

Dicing is then performed with respect to a second semiconductor wafer on which the second semiconductor chips 20 are formed so that the second semiconductor chips 20 are separated from each other. Subsequently, the insulating resin 30 is applied to the region of the first semiconductor chip 10 on which the second semiconductor chip 20 is to be mounted. Since the internal electrodes 11 are offset to the left from the center of the first semiconductor chip 10, the region coated with the insulating resin 30 is also offset to the left from the center of the first semiconductor chip 10.

Next, each of the second semiconductor chips 20 is positioned over the corresponding one of the first semiconductor chips 10 formed on a wafer, while the bumps 22 of the second semiconductor chip 20 are aligned with and brought in contact with the first internal electrodes 11 of the first semiconductor chip 10. In the arrangement, the center of the second semiconductor chip 20 is offset to the left from the center of the first semiconductor chip 10.

Figure 5B:
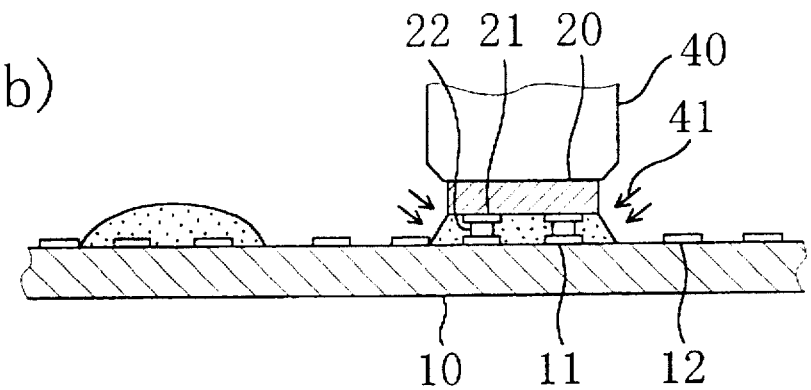

Next, as shown in FIG. 5(b), the second semiconductor chip 20 is pressed against the first semiconductor chip 10 by means of a pressing tool 40 so that the bumps 22 of the second semiconductor chip 20 are bonded to the first internal electrodes 11 of the first semiconductor chip 10, while the insulating resin 30 is spread out between the first semiconductor chip 10 and the second semiconductor chip 20. After that, the insulating resin 30 is cured with the radiation of a UV ray 41, thereby integrating the first semiconductor chip 10 and the second semiconductor chip 20.

Figure 5C:
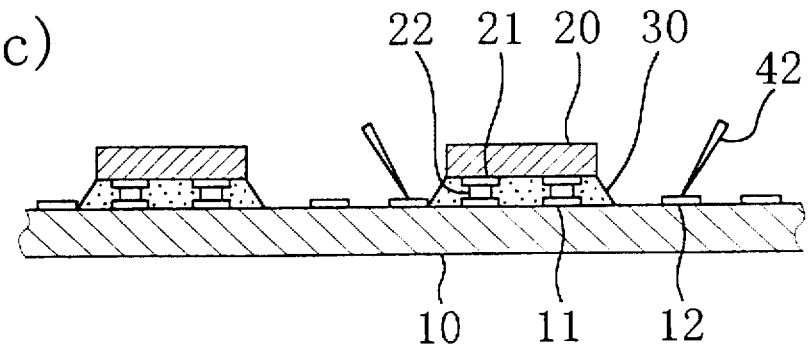

Next, as shown in FIG. 5(c), probe terminals 42 of a prober are brought in contact with the bonding pads 12 of the first semiconductor chip 10 so as to examine the electric properties of the first and second LSIs of the first and second semiconductor chips 10 and 20 simultaneously. Thereafter, polishing is performed with respect to the back faces of the plurality of second semiconductor chips 20, though the drawing thereof is omitted.

Figure 6A:
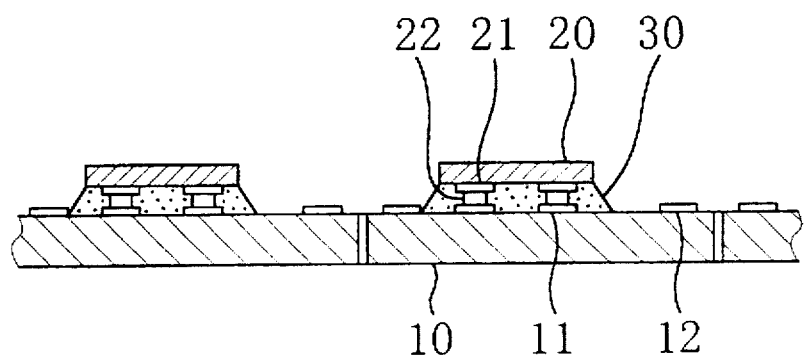
FIGS. 6(a) and 6(b) are cross-sectional views illustrating the individual process steps in the method of manufacturing the semiconductor device according to the third embodiment.
Figure 6B:
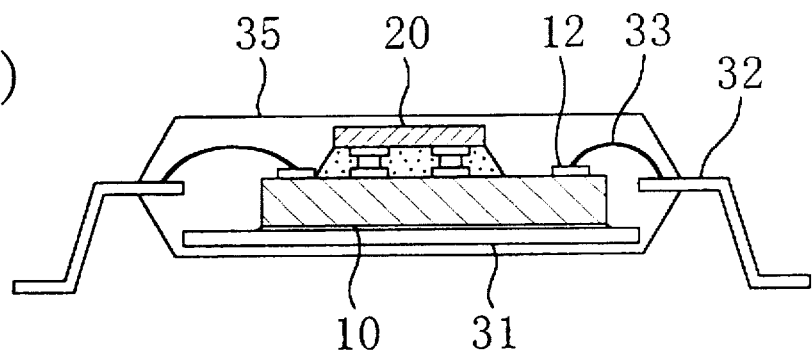

Then, as shown in FIG. 6(a), dicing is performed with respect to the first semiconductor wafer on which the first semiconductor chips 10 are formed so that the first semiconductor chips 10 are separated from each other. After the separation of the first semiconductor chips 10, each of the first semiconductor chips 10 is fixed to a die pad 31 of a lead frame, while the bonding pads 12 of the first semiconductor chip 10 are connected to outer leads 32 by bonding wires 33. Then, as shown in FIG. 6(b), the first and second semiconductor chips 10 and 20, the bonding wires 33, the die pad 31, and parts of the outer leads 32 are packaged by using a molding resin 35. In the present embodiment, packaging is performed so that the center of the second semiconductor chip 20 is substantially coincident with the center of the molding resin 35 and that the center of the first semiconductor chip 10 is offset to the right from the center of the molding resin 35.

To fix the first semiconductor chip 10 to the die pad 31 of the lead frame, either of the following two methods can be selected properly. The right-hand and left-hand inner leads of the lead frame may have different lengths so that the position of the die pad 31 is offset to the right from the center of the lead frame and that the first semiconductor chip 10 is placed with the center thereof being coincident with the center of the die pad 31. Alternatively, the die pad 31 may be positioned at the center of the lead frame so that the first semiconductor chip 10 is placed with the center thereof being offset to the right from the center of the die pad 31, as shown in FIG. 6(b).

The amount of offset between the center of the first semiconductor chip 10 and the center of the molding resin 35 can be determined as follows. When the first semiconductor chips 10 is 10 mm square, the second semiconductor chip 20 is 4 mm square, and the molding resin 35 is 16 mm square, the center of the second semiconductor chip 20 is matched with the center of the molding resin 35, while the center of the first semiconductor chip 10 is offset from the center of the molding resin 35 by 1 mm. In the arrangement, the distances between the side faces of the first semiconductor chip 10 and the corresponding side faces of the molding resin 35 are 2 mm and 4 mm.

In the semiconductor device according to the third embodiment, the center of the second semiconductor chip 20 is substantially coincident with the center of the molding resin 35, so that the distance between the right side face of the second semiconductor chip 20 and the right outer face of the molding resin 35 is equal to the distance between the left side face of the second semiconductor chip 20 and the left outer face of the molding resin 35. Accordingly, an equal curing compressive stress is placed on the right and left side faces of the second semiconductor chip 20 when the molding resin 35 is cured, while an equal thermal stress resulting from the thermal expansion of the molding resin 35 is placed on the right and left side faces of the second semiconductor chip 20.

On the other hand, the center of the first semiconductor chip 10 is offset from the center of the molding resin 35. Accordingly, different curing compressive stresses are placed on the right and left side faces of the first semiconductor chip when the molding resin 35 is cured, while different thermal stresses resulting from the thermal expansion of the molding resin 35 are placed on the right and left side faces of the first semiconductor chip 10.

Figure 10A:
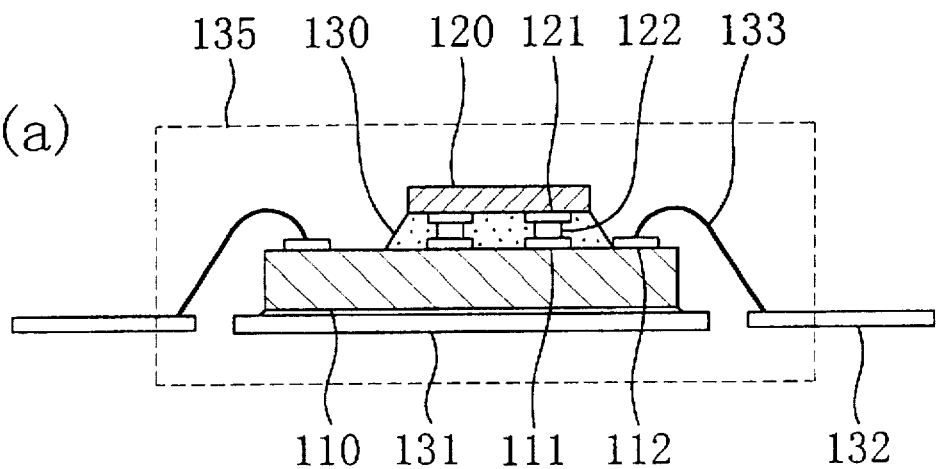
FIG. 10 is a cross-sectional view of the semiconductor device on which the present invention is based.
Figure 10B:
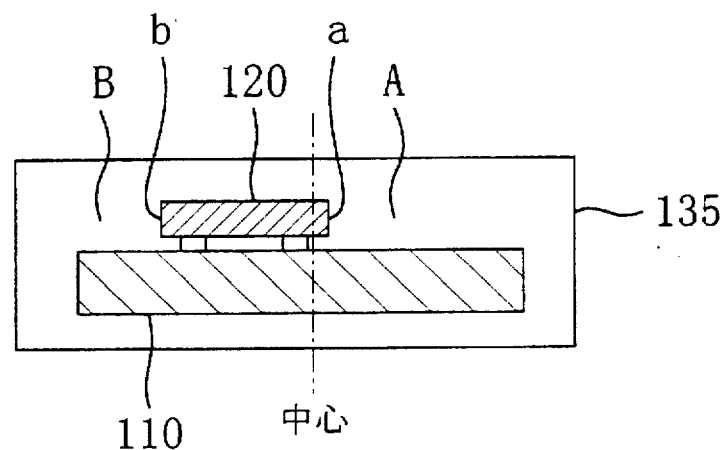

However, since first semiconductor chip 10 is larger in size than the second semiconductor chip 20, the amount of the molding resin 30 present on the sides of the first semiconductor chip 10 is smaller than the amount of the molding resin 30 present on the sides of the second semiconductor chip 20. Consequently, the difference between the curing compressive stresses and the difference between the thermal stresses both developed in the molding resin 35 and placed on the right and left side faces of the first semiconductor chip 10 in the semiconductor device according to the present embodiment is smaller than the difference between the curing compressive stresses and the difference between the thermal stresses both developed in the molding resin 135 and placed on the right and left side faces of the second semiconductor chip 120 in the conventional semiconductor device shown in FIG. 10. Accordingly, the shearing stress along the plane resulting from different curing compressive stresses and different thermal stresses in the molding resin 35 and placed on the connecting portion between the first and second semiconductor chips 10 and 20 is smaller in the semiconductor device according to the present embodiment than in the conventional semiconductor device.

Figure 7:
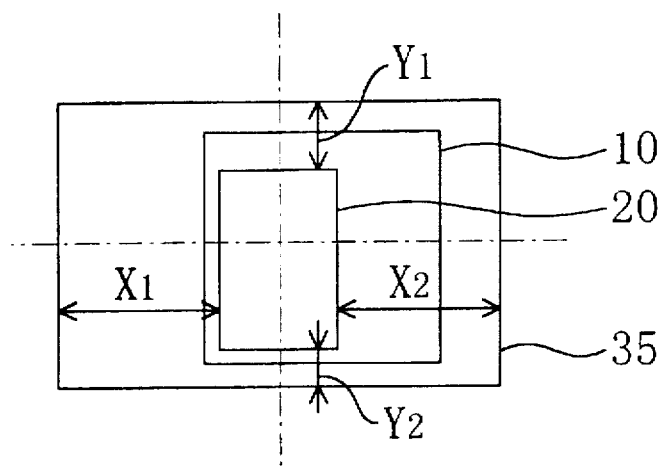
FIG. 7 is a plan view showing a variation of the semiconductor device obtained by the method of manufacturing the semiconductor device according to the third embodiment.
Figure 8:
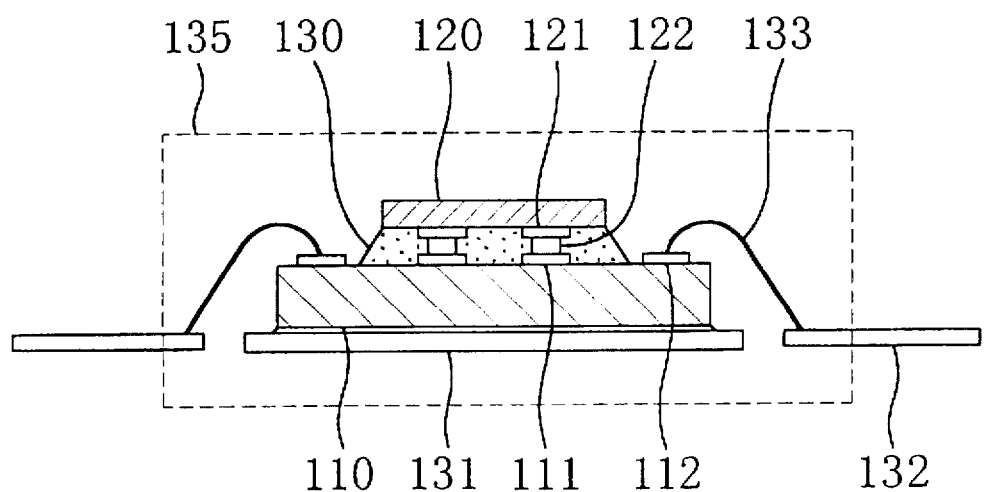
FIG. 8 is a cross-sectional view of a conventional semiconductor device.
Figure 9:
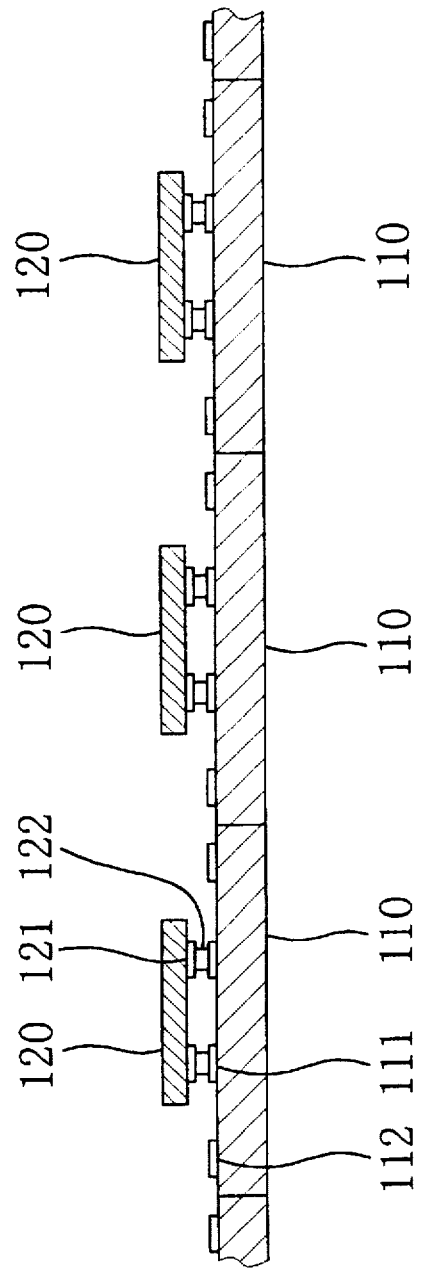
FIG. 9 is a cross-sectional view illustrating a process step of manufacturing the conventional semiconductor device.

Although the first and second semiconductor chips 10 and 20 and the molding resin 30 have square plan configurations, they may have rectangular plan configurations, as shown in FIG. 7. When the second semiconductor chip 20 is rectangular, the center of the first semiconductor chip 10 is preferably offset from the center of the second semiconductor chip 20 in the direction in which the shorter edge of the second semiconductor chip 20 extends, while the center of the second semiconductor chip 20 is preferably substantially coincident with the center of the molding resin 30. In short, $X_1$ is preferably equal to $X_2$ in FIG. 7. In the arrangement, there is no difference between the curing compressive stresses and between the thermal stresses both placed on the right and left side faces of the second semiconductor chip 20 shown in FIG. 7. In this case, although $Y_1$ is different from $Y_2$ in FIG. 7, the amount of the molding resin 30 present in the vertical direction of FIG. 7 is smaller than the amount of the molding resin 30 present in the horizontal direction of FIG. 7, so that the difference between the curing compressive stresses and the difference between the thermal stresses both placed on the smaller side faces of the second semiconductor chip 20 are less affective. It will be appreciated that, when the second semiconductor chip 20 is rectangular, the center of the second semiconductor chip 20 is preferably substantially coincident with the center of the molding resin 30 in the direction in which the longer edge of the second semiconductor chip 20 extends, i.e., $Y_1$ is preferably equal to $Y_2$.

In the foregoing first to third embodiments, the type of the package of the semiconductor device is not particularly limited so that a package of QFP type, PGA type, or BGA type may be used properly. As a material composing the package, a molding ceramic or the like may be used properly instead of the molding resin.

We claim:

1. A semiconductor device comprising:

a first semiconductor chip having a first LSI;

a second semiconductor chip having a second LSI, said second semiconductor chip being smaller in size than said first semiconductor chip and connected to said first semiconductor chip by face down bonding; and a package for packaging said first and second semiconductor chips, wherein the center of said first semiconductor chip is offset from the center of said second semiconductor chip in a first direction in which a first one of two contiguous edges of said second semiconductor chip extends, said first edge being as long as or shorter than the other one of the two contiguous edges, while the center of said second semiconductor chip is substantially coincident with the center of said package.

2. A semiconductor device according to claim 1, wherein the center of said first semiconductor chip is offset from the center of said second semiconductor chip in a second direction in which a second one of the two contiguous edges of said second semiconductor chip extends, said second edge being different from said first edge, while the center of said second semiconductor chip is substantially coincident with the center of said package.

* * * * *